(12) United States Patent
DeNatale et al.

(10) Patent No.: US 8,080,736 B2
(45) Date of Patent: Dec. 20, 2011

(54) NON-PLANAR MICROCIRCUIT STRUCTURE AND METHOD OF FABRICATING SAME

(75) Inventors: Jeffrey F. DeNatale, Thousand Oaks, CA (US); Philip A. Stupar, Oxnard, CA (US); Robert L. Borwick, III, Thousand Oaks, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 439 days.

(21) Appl. No.: 12/372,982

(22) Filed: Feb. 18, 2009

(65) Prior Publication Data

US 2010/0207229 A1 Aug. 19, 2010

(51) Int. Cl.
*H05K 1/00* (2006.01)
(52) U.S. Cl. .......................... 174/254; 174/250; 361/749
(58) Field of Classification Search .................. None
See application file for complete search history.

(56) References Cited

U.S. PATENT DOCUMENTS

| | | | | |
|---|---|---|---|---|
| 6,476,733 B1* | 11/2002 | Amiri | ............................... | 341/20 |
| 7,084,007 B2* | 8/2006 | Perlov et al. | .................. | 438/107 |
| 7,443,678 B2* | 10/2008 | Han et al. | ....................... | 361/704 |
| 7,521,292 B2* | 4/2009 | Rogers et al. | ................. | 438/118 |
| 7,531,371 B2* | 5/2009 | Rather et al. | ..................... | 438/24 |
| 7,660,126 B2* | 2/2010 | Cho et al. | ....................... | 361/749 |
| 2010/0165562 A1* | 7/2010 | Segaram | .................. | 361/679.31 |

OTHER PUBLICATIONS

Yoon, Jongseung et al.; "Ultrathin Silicon Solar Microcells for Semitransparent, Mechanically Flexible and Microconcentrator Module Designs"; Nature Materials; vol. 7; MacMillan Publishers Limited; Published Online: Oct. 5, 2008; URL:http://www.nature.com/naturematerials; pp. 907-915; 1-8; Figure S1-15; and Table S1.

Bullis, Kevin; "Expandable Silicon"; Published by MIT Technology Review: Dec. 14, 2008; Retrieved From the Internet: URL:http://www.technologyreview.com; pp. 1-4.

Rogers, John et al.; "The Shape of Things to Come"; Press Release 08-132; National Science Foundation; Aug. 6, 2008; Retrieved From the Internet: URL:http://www.nsf.gov/news/news_summ; pp. 1-3.

Kim, Dae-Hyeong et al.; Stretchable Electronics: Materials Strategies and Devices Advanced Materials; vol. 20; 2008 Wiley-VCH Verlag GmBH & Co., KGaA; Weinheim; pp. 1-6.

(Continued)

*Primary Examiner* — Boris Chervinsky
(74) *Attorney, Agent, or Firm* — Koppel, Patrick, Heybl & Philpott

(57) ABSTRACT

A foldable microcircuit is initially a planar semiconductor wafer on which circuitry has been formed. The wafer is segmented into a plurality of tiles, and a plurality of hinge mechanisms are coupled between adjacent pairs of tiles such that the segmented wafer can be folded into a desired non-planar configuration having a high fill-factor and small gaps between tiles. The hinge mechanisms can comprise an organic material deposited on the wafer such that it provides mechanical coupling between adjacent tiles, with metal interconnections between tiles formed directly over the organic hinges, or routed between adjacent tiles via compliant bridges. Alternatively, the interconnection traces between tiles can serve as part or all of a hinge mechanism. The foldable microcircuit can be, for example, a CMOS circuit, with the segmented tiles folded to form, for example, a semi-spherical structure arranged to provide a wide FOV photodetector array.

29 Claims, 5 Drawing Sheets

OTHER PUBLICATIONS

Rim, Seung-Bum et al.; "The Optical Advantages of Curved Focal Plane Arrays"; Electrical Engineering; Stanford University; Stanford, California; vol. 16, No. 7; Published Mar. 27, 2008; Optics Express; pp. 4965-4971.

Dinyari, Rostam; "Curving Monolithic Silicon for Nonplanar Focal Plane Array Applications"; Applied Physics Letters, vol. 92; Electrical Engineering Department; Stanford University; Stanford, California; Published Online Mar. 5, 2008; 3 pp.

Kim, Dae-Hyeong et al.; "Complementary Logic Gates and Ring Oscillators on Plastic Substrates by Use of Printed Ribbons of Single-Crystalline Silicon"; IEEE Electron Device Letters, vol. 29; No. 1, Jan. 2008; pp. 73-76.

Kim, Dae-Hyeong et al.; "Complementary Metal Oxide Silicon Integrated Circuits Incorporating Monolithically Integrated Stretchable Wavy Interconnects"; 2008 American Institute of Physics; Applied Physics Letters, vol. 93; Published Online Jul. 31, 2008; 3 pp.

Kim, Dae-Hyeong et al.; Stretchable and Foldable Silicon Integrted Circuits; vol. 320; Apr. 25, 2008; Retrieved From the Internet: URL:http://www.sciencemag.org; 21 pp.

Bogatin, Eric; "Origami-Style Simplifies Packaging Efficiency"; Semiconductor International; Feb. 1, 2003; Retrieved From the Internet: URL:HTTP://www.semiconductor.net; pp. 1-2.

* cited by examiner

FIG. 1a
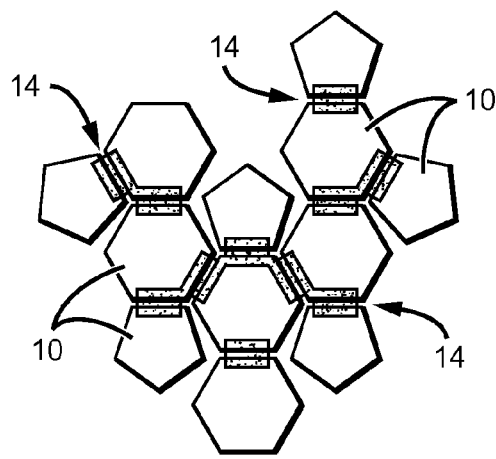
FIG. 1b
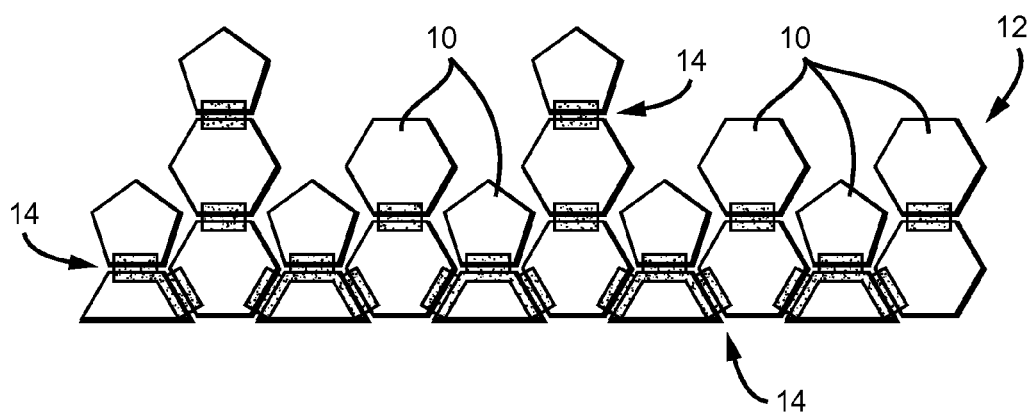
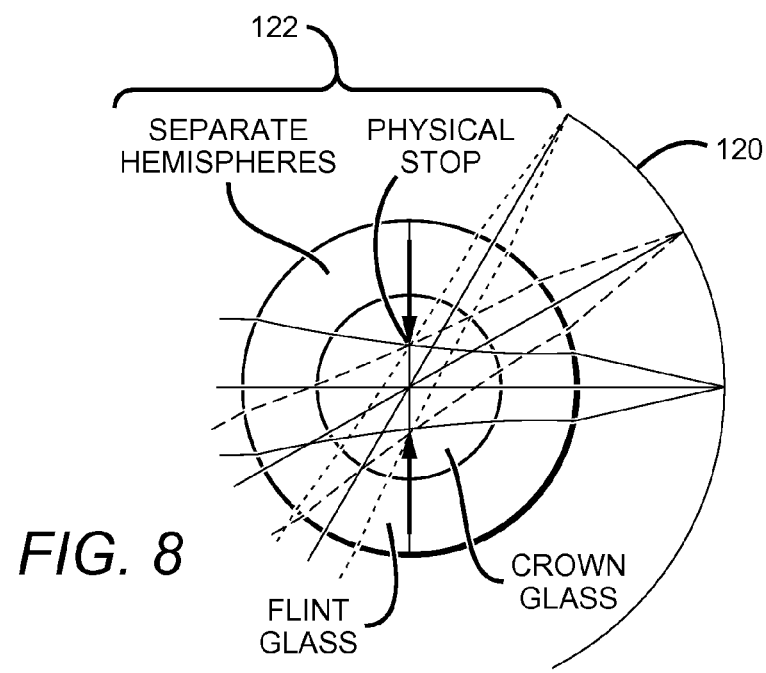
FIG. 8

NON-PLANAR MICROCIRCUIT STRUCTURE AND METHOD OF FABRICATING SAME

FIELD OF THE INVENTION

This invention is directed to a microcircuit structure capable of being folded into a non-planar configuration, and a method for fabricating such structures.

BACKGROUND

There are many applications in which it would be advantageous to provide non-planar integrated circuitry. For example, an optical imager requires large, heavy and complex optics if a wide field-of-view (FOV) image is to be projected onto a planar array of photodetectors. Being able to curve the photodetector array into a desired shape would simplify the optics required and substantially improve the imager's optical performance.

However, non-planar electronics are difficult to manufacture, and generally suffer from reduced performance when compared with state-of-the-art CMOS electronics, for example. Organic substrates are commonly used to provide flexible electronics, but organic substrate-based circuits typically provide a lower density of active circuitry, and are limited to operating at lower frequencies when compared with CMOS.

Another approach involves dividing a circuit into a number of adjacent segments which are foldable along their borders; one example is the 3-Die μZ™ Folded Die Stack from Tessera, Inc. However, this technique tends to accommodate a limited number of segments, and requires large dimension interconnections between segments.

SUMMARY OF THE INVENTION

Presented herein is a microcircuit structure and fabrication method which enables the structure to be folded into a desired non-planar configuration.

A structure as described herein is initially a planar semiconductor wafer on which circuitry has been formed. The planar wafer is segmented into a plurality of tiles, and a plurality of hinge mechanisms are coupled between adjacent pairs of tiles. The tiles and hinge mechanisms are arranged such that the segmented wafer can be folded into a desired non-planar configuration having a high fill-factor and small gaps between tiles.

Several means are described by which the structure's hinge mechanisms can be provided. For example, the hinge mechanisms can comprise an organic material deposited on the wafer such that it provides mechanical coupling between adjacent pairs of tiles. Metal interconnection traces that provide electrical connections between adjacent pairs of tiles can be formed directly over the organic hinge mechanisms, or can be routed between adjacent pairs of tiles via compliant bridges that span the adjacent pairs of tiles.

Alternatively, the structure's metal interconnection traces which provide electrical connections between adjacent pairs of tiles can serve as part or all of a hinge mechanism. If desired, the interconnection hinge mechanisms can be arranged to accommodate angular deflection between the hinge mechanism's adjacent pair of tiles. The metal interconnection hinge mechanisms, which are preferably conformally coated, might also include two or more levels of metal.

The foldable microcircuit can be fabricated by post-processing a semiconductor wafer, such as a standard CMOS circuit, to form the segmented wafer. The tiles into which the wafer is segmented are shaped to permit a high fill-factor in a folded geometry. When so arranged, the segmented wafer can be folded to form, for example, a piecewise curved structure. Such a structure could be, for example, a semi-spherical structure arranged to provide a wide FOV photodetector array.

Further features and advantages of the invention will be apparent to those skilled in the art from the following detailed description, taken together with the accompanying drawings.

BRIEF DESCRIPTION OF THE DRAWINGS

The detailed description of embodiments of the invention will be made with reference to the accompanying drawings, wherein like numerals designate corresponding parts in the figures.

FIGS. 1a and 1b are plan views of a segmented and hinged microcircuit structure in accordance with the present invention.

FIG. 8 is a diagram illustrating the use of optical elements and a segmented and hinged microcircuit structure in accordance with the present invention to form a wide FOV photodetector array.

DETAILED DESCRIPTION OF THE INVENTION

Figure 2A:
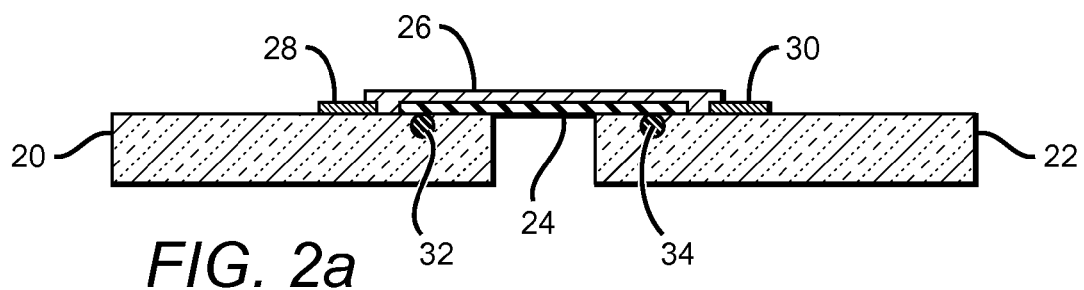
FIGS. 2a and 2b are corresponding sectional and plan views, respectively, illustrating one possible metal interconnection scheme for a segmented and hinged microcircuit structure in accordance with the present invention.

The present invention enables a microcircuit structure to be folded into a desired non-planar configuration. Two exemplary embodiments are shown in FIGS. 1a and 1b. In each example, circuitry (not shown) has been fabricated on a semiconductor wafer, which has then been segmented into a plurality of tiles 10. To hold the segments together and enable the segmented structure to be folded, a plurality of hinge mechanisms 14 are coupled between adjacent pairs of tiles. The tiles and hinge mechanisms are arranged such that the segmented wafer can be folded into a desired non-planar configuration having a high fill-factor and small gaps between tiles.

In one embodiment, the microstructure's plurality of hinge mechanisms can comprise an organic material deposited on the wafer such that it provides mechanical coupling between adjacent pairs of tiles. The organic material can be, for example, a vapor deposited polymer material which is preferably insulating, as an insulating material helps to prevent short circuits between tiles and/or interconnection traces. Parylene is a preferred organic material. If desired, the deposited organic material can be is patterned and etched, preferably using a dry etching process, such that it is only present in the gaps between and near the adjacent edges of adjacent pairs of tiles; FIGS. 1a and 1b illustrate this possibility, in which the darker shaded portions represent the hinge mechanisms.

There are several means by which electrical connections can be effected between adjacent pairs of tiles when the microstructure's hinge mechanisms are provided by a deposited organic material. One possibility is illustrated in the corresponding sectional and plan views shown in FIGS. 2a and 2b, respectively. Two adjacent tiles 20, 22 are shown, upon which electronic circuitry (not shown) has been fabricated. A hinge mechanism 24 comprises an organic material which has been deposited, patterned and etched such that it couples tiles 20 and 22 together mechanically, and is present only in the gaps between and near the adjacent edges of the pair of tiles. One or more metal interconnection traces 26 can then be formed directly over the patterned and etched organic material; in the example shown, trace 26 runs between contact pad areas 28 and 30 on tiles 20 and 22, respectively, via hinge mechanism 24.

Since the structure is going to be folded, the hinge mechanisms and the metal interconnection traces need to be on the same side of the wafer, which can be either the topside or backside.

It may be advantageous for adjacent pairs of tiles to include respective recessed etches, positioned so as to improve the adherence of the organic material hinge mechanism to the segmented tiles. An example of this is shown in FIG. 2a, in which tiles 20 and 22 include recessed etches 32 and 34, respectively, which serve to improve the adherence of organic material hinge mechanism 24 to tiles 20 and 22.

Recessed etches can be used when the hinge mechanisms are located on the wafer's circuit side, or its non-circuit side. When used on the circuit side, the etch must be located in an 'exclusion zone' which does not contain routing metal or circuitry. Alternatively, attachment features could be deposited or plated onto the surface on the circuit side, which would improve adherence without requiring an exclusion zone.

Figure 3A:
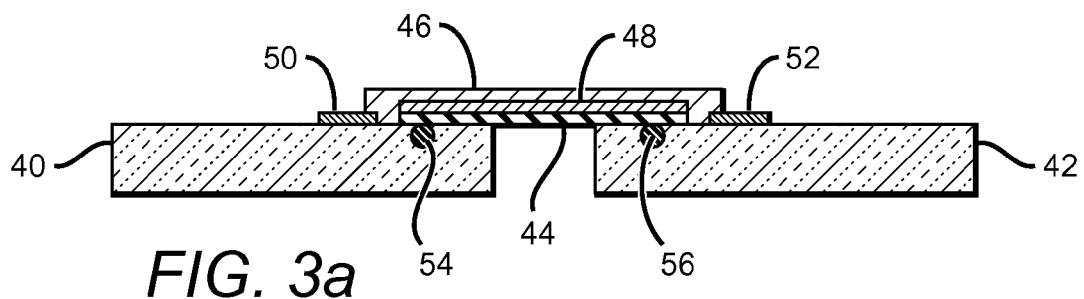
FIGS. 3a and 3b are corresponding sectional and plan views, respectively, illustrating another possible metal interconnection scheme for a segmented and hinged microcircuit structure in accordance with the present invention.
Figure 3B:
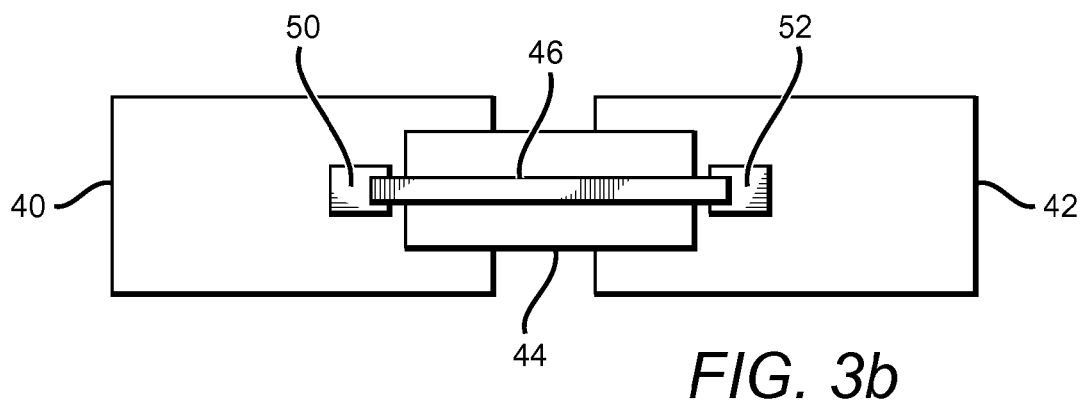

Another means of effecting electrical connections between adjacent pairs of tiles for a microstructure employing organic hinge mechanisms is illustrated in the corresponding sectional and plan views shown in FIGS. 3a and 3b, respectively. Two adjacent tiles 40, 42 are shown, on which electronic circuitry (not shown) has been fabricated. A hinge mechanism 44 comprises an organic material which has been deposited, patterned and etched such that it couples tiles 40 and 42 together mechanically, and is present only in the gaps between and near the adjacent edges of the pair of tiles. Here, however, the metal interconnection traces 46 that provide electrical connections between the adjacent tiles are routed over hinge mechanism 44 via a compliant bridge 48 (seen in FIG. 3a) that spans the tiles. Compliant bridge 48 can comprise thin film metals such as aluminum or gold. As before, interconnection trace 46 may terminate at contact pad areas 50 and 52 on tiles 40 and 42, respectively, and recessed etches 54 and 56 may serve to improve the adherence of organic material hinge mechanism 44 to tiles 40 and 42, respectively. Note that, though compliant bridge 48 is shown as being formed directly above hinge 44, some or all the structure's compliant bridges might alternatively be located adjacent to the hinges.

Figure 4A:
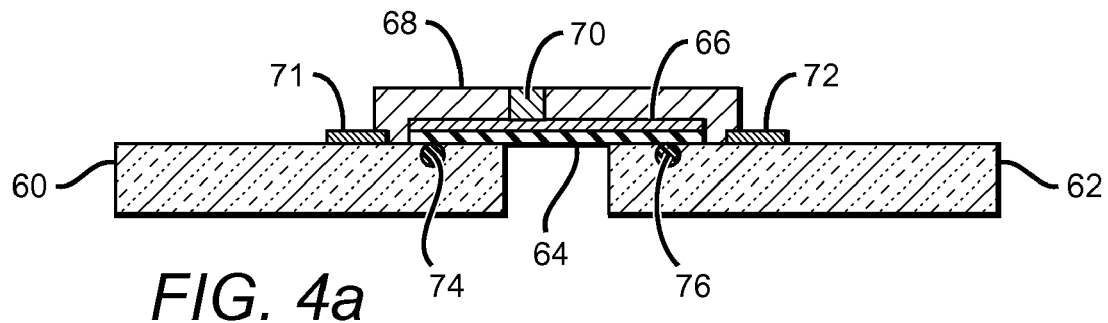
FIGS. 4a and 4b are corresponding sectional and plan views, respectively, illustrating another possible metal interconnection scheme for a segmented and hinged microcircuit structure in accordance with the present invention.
Figure 4B:
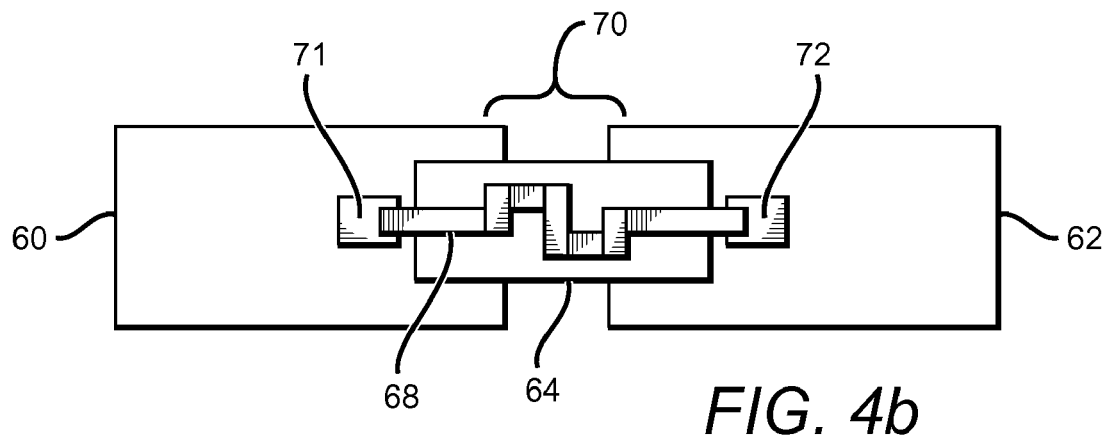

One or more of the metal traces interconnecting adjacent tiles may be arranged to accommodate angular deflection between the tiles. This is accomplished by forming the trace so as to permit at least some bending and/or twisting without breaking. One possible embodiment is illustrated in the corresponding sectional and plan views shown in FIGS. 4a and 4b, respectively. Two adjacent tiles 60, 62 are shown. A hinge mechanism 64 comprises an organic material which has been deposited, patterned and etched such that it couples tiles 60 and 62 together mechanically. As in FIGS. 3a and 3b, a compliant bridge 66 is formed over hinge 64, on which metal interconnection traces between adjacent tiles can be supported. Here, however, the metal interconnection trace 68 includes a lateral jog 70, which enables the trace to withstand some degree of bending and/or twisting without breaking. As before, interconnection trace 68 may terminate at contact pad areas 71 and 72 on tiles 60 and 62, respectively, and recessed etches 74 and 76 may serve to improve the adherence of organic material hinge mechanism 64 to tiles 60 and 62, respectively.

Figure 2B:
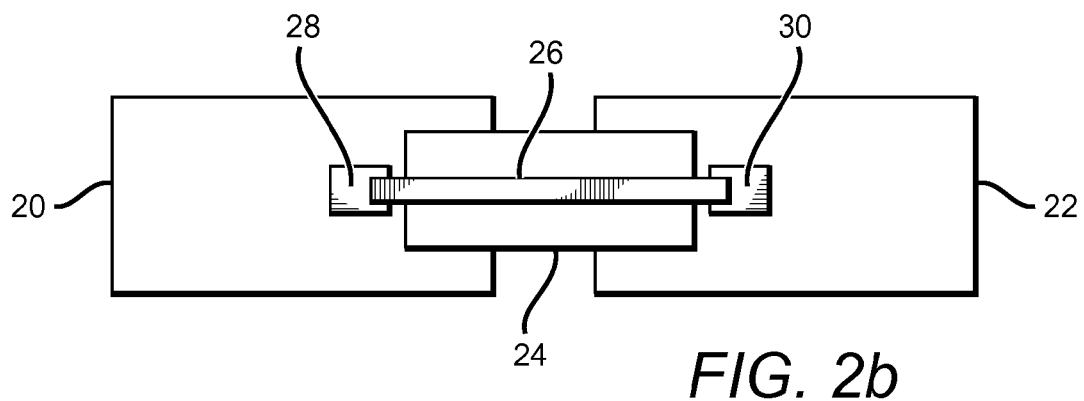

Note that metal interconnection traces arranged to accommodate angular deflection between tiles might also be employed with an embodiment such as that shown in FIGS. 2a and 2b, in which the traces are formed directly over the patterned and etched organic material making up a hinge.

As noted above, electrical connections between adjacent tiles may be effected with metal interconnection traces. In another possible embodiment of the invention, the metal interconnection traces between adjacent tiles can serve as all or part of the hinge mechanism coupling the pair together. The metal interconnection traces between tiles may be part of the interconnect metal required for the circuitry fabricated on the wafer. For example, if the circuitry is a CMOS circuit, the metal interconnection traces between tiles may be formed directly from the multilayer routing metal that is part of the CMOS circuit.

The traces are preferably conformally coated so as to provide additional mechanical coupling and structural integrity between adjacent tiles, and to provide protection for the traces. The conformal coating preferably comprises a polymer, which can be applied as a layer that is on the top or the bottom of the traces, or preferably, as layers on both the top and bottom of the traces, which serves to minimize the strain on the metal.

Figure 5A:
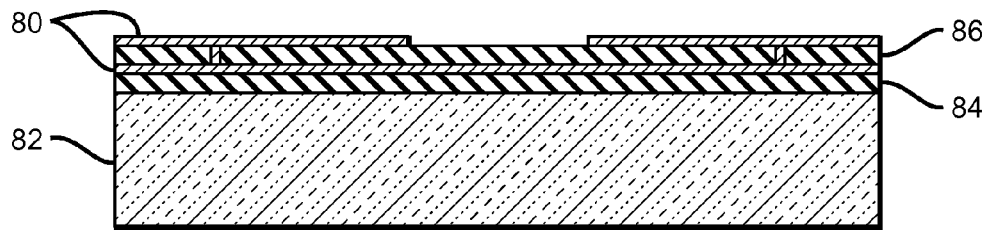
FIGS. 5a-5e are sectional views illustrating one possible means of fabricating a segmented and hinged microcircuit structure in accordance with the present invention.
Figure 5B:
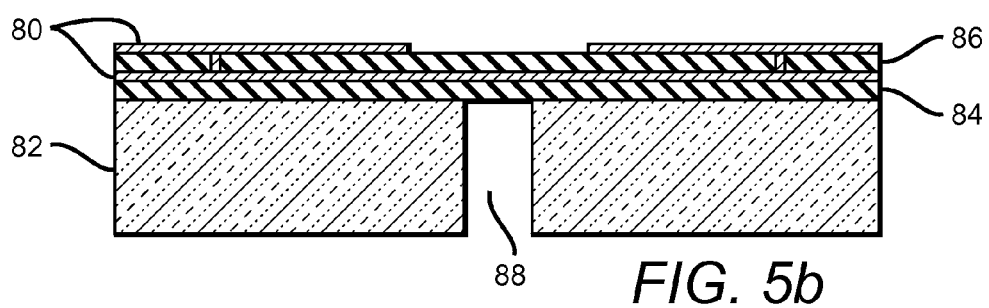

FIGS. 5a-5e are sectional views illustrating one possible means of fabricating a segmented and hinged microcircuit structure in accordance with the present invention, in which the metal interconnection traces between adjacent tiles serve as all or part of the hinge mechanism coupling the pair together. In FIG. 5a, circuitry (not shown) and metal interconnect traces 80 are formed on a planar semiconductor wafer 82 in a conventional manner, with dielectric layers 84, 86 employed as needed. As noted above, if the circuitry is, for example, a CMOS circuit, metal interconnect traces 80 may be comprised of one or more of the layers of routing metal in the CMOS circuit process. A trench 88 is etched into the backside of the wafer, up to first dielectric layer 84 (FIG. 5b). The wafer is preferably etched using a deep reactive-ion etching (DRIE) process, such as by using a time-sequenced etch and passivation chemistry. The resulting gaps between tiles should be sized so as to allow each tile to move, while at the same time minimizing the dead space of the structure created when the segmented tiles are folded into the desired shape.

Figure 5C:
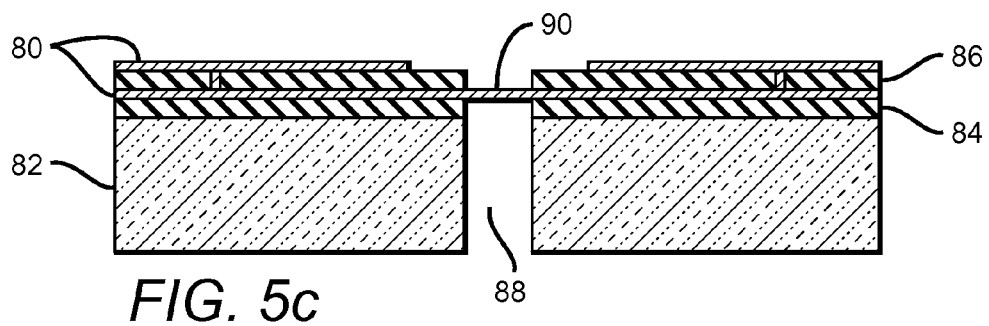
Figure 5D:
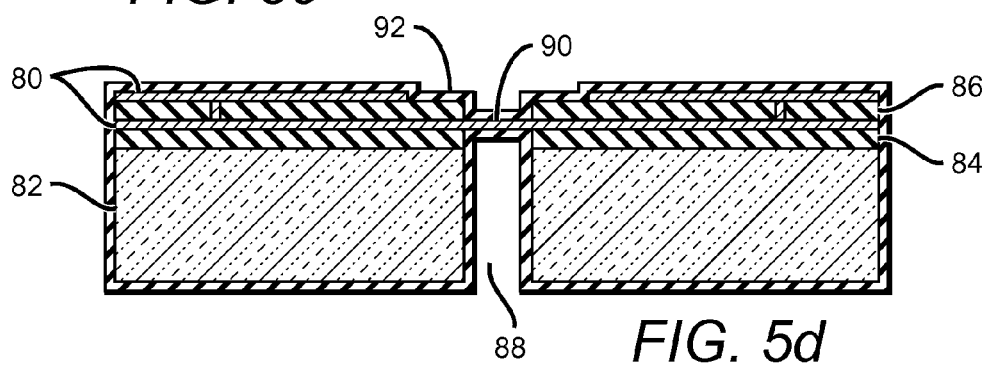
Figure 5E:
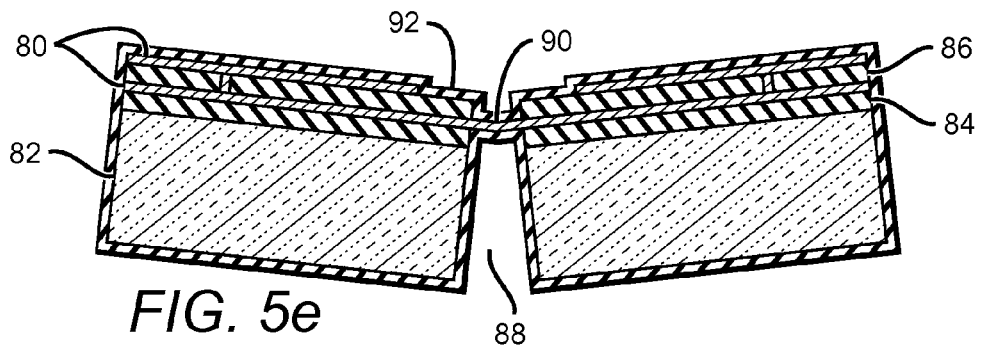

The dielectric layer in the gap formed by the trench is then etched away, releasing the metal interconnection 90 (FIG. 5c). If desired, a conformal coating 92 is deposited over the wafer—thereby providing conformal layers on both the top and bottom of interconnection 90—to provide mechanical support (FIG. 5d). As shown in FIG. 5e, the microstructure is now flexible and can be deformed into a non-planar shape. By using the structure's metal interconnections in this way, the need for subsequent post-processing of inter-segment electrical interconnects is eliminated. This approach also enables a high density of electrical interconnects, and allows the circuit to be tested prior to any post-processing.

A microstructure as described herein can be based on a variety of semiconductor materials and contain a variety of circuit types. For example, in one preferred embodiment, the structure is a CMOS circuit with aluminum interconnects, fabricated on a silicon wafer using conventional CMOS fabrication techniques. In this case, a foldable circuit is provided by post-processing the planar CMOS circuit to form a segmented circuit. This approach enables a designer to exploit state-of-the-art foundry CMOS technology that exists for planar CMOS circuit design and fabrication, with no sacrifices in performance. It also enables the fabrication of circuits that have a higher density and performance than can be achieved with designs employing flexible organic substrates.

The widths of the segmented tiles would typically be on the order of tens of microns to several millimeters; if the tiles are smaller than about 10 microns, the gap between adjacent tiles would dominate die area consumption, while tiles larger than a few millimeters would significantly limit the number of tiles that would fit within a given planar die area, unless a very large die size were available.

Figure 6A:
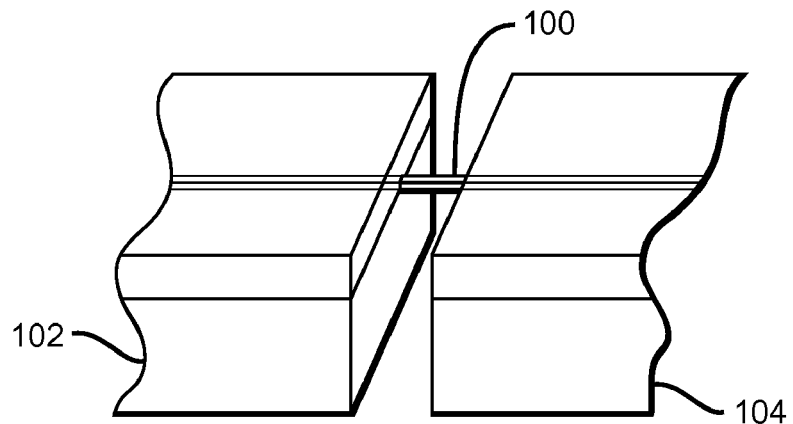
FIGS. 6a-6c are perspective view illustrating three possible metal interconnection schemes that might be used for a segmented and hinged microcircuit structure in accordance with the present invention.
Figure 6B:
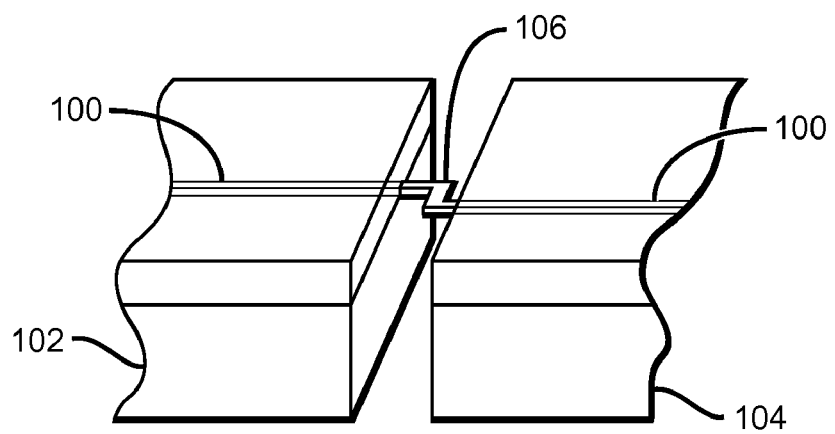

As described above in relation to FIGS. 4a and 4b, one or more of the metal traces interconnecting adjacent tiles may be arranged to accommodate angular deflection between the tiles, accomplished by forming the trace so as to withstand at least some bending and/or twisting without breaking. This is illustrated for an embodiment in which the interconnection traces serve as all or part of the hinge mechanisms in FIGS. 6a and 6b. In FIG. 6a, a metal interconnection trace 100 connects a segmented tile 102 with a segmented tile 104. In this embodiment, there is no accommodation for angular deflection. In FIG. 6b, metal interconnection trace 100 is fabricated such that it includes a lateral jog 106, which enables the trace to accommodate more angular deflection between the tiles than can the arrangement of FIG. 6a. Note that there are many ways in which the interconnection traces could be fabricated so as to improve the degree to which they accommodate angular deflection; a lateral jog as shown in FIG. 6b is but one way.

Figure 6C:
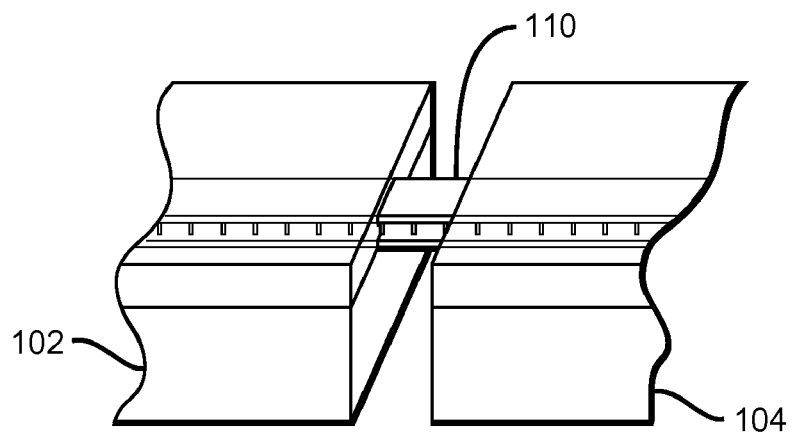

Another possibility is shown in FIG. 6c. Here, the metal interconnection trace 110 between tiles 102 and 104 is fabricated such that it has more than one level; a two-level trace is shown in FIG. 6c. A multi-level arrangement of this sort serves to increase the rigidity of the structure.

As noted above, it is essential that the tiles into which a wafer is segmented are shaped to permit a high fill-factor in a folded geometry. In general, a desired 3D shape can be decomposed into a planar surface, and existing IC infrastructure can be leveraged to fabricate the resulting 2D circuit. By designing the tiles appropriately, complex 3D shapes can be formed.

A desired non-planar configuration can be achieved by, for example, folding the segmented wafer around a mandrel. Such a mandrel would preferably be soluble or have a soluble surface layer to facilitate release, and a post-processing step or steps would be performed by which the mandrel or release layer would be dissolved.

Figure 7:
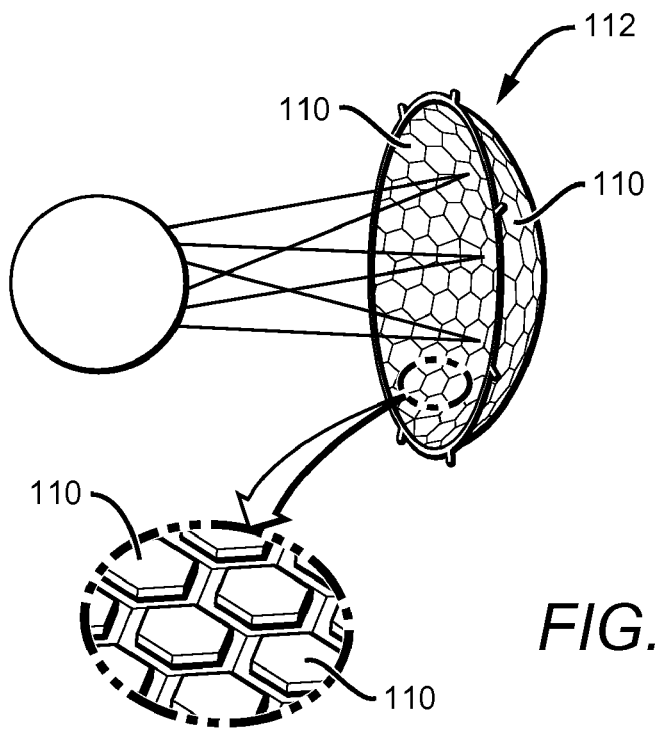
FIG. 7 is a perspective view illustrating the use of a segmented and hinged microcircuit structure in accordance with the present invention as a curved photodetector array.

One highly desirable 3D shape is a curved surface. For example, circuit tiles segmented and hinged as described herein can be shaped such that they can be folded to form a piecewise curved structure, such as a spherical or semi-spherical structure. An example is shown in FIG. 7. Here, the segmented tiles 110 are shaped such that the resulting structure can be folded to form a piecewise semi-spherical structure 112 having a high fill-factor and small gaps between tiles.

One possible application for a structure of this sort is a curved photodetector array. As noted above, an optical imager requires large, heavy and complex optics if a wide FOV image is to be projected onto a planar array of photodetectors. Being able to curve the photodetector array simplifies the optics required and substantially improves the imager's optical performance.

A photodetector array made in accordance with the invention can provide a wide FOV (~120°) with simple optics. A diagram illustrating this is shown in FIG. 8. A photodetector array 120 curved as described herein is provided, and optical elements 122 are positioned in front of the array such that incoming light is focused on the concave surface of the array over a wide FOV.

A photodetector array as shown in FIGS. 7 and 8 might comprise one or more additional layers. For example, an additional layer might be employed to provide a readout circuit for the photodetector array.

There are many possible applications for a foldable microcircuit as described herein. A curved photodetector or focal plane array (FPA) as described above can be used to provide a wide FOV imager; such an imager could be deployed, for example, as part of a remote sensor or an unmanned aerial vehicle (UAV). A curved structure of this sort might also be beneficial for a directionally-specific circuit such as an acoustic sensor, or to fit a circuit into a confined space or to conform it to a host's platform geometry.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A foldable microcircuit, comprising:
a semiconductor wafer on which circuitry has been formed and which has been segmented into a plurality of tiles; and
a plurality of hinge mechanisms coupled between adjacent pairs of said tiles;
said tiles and hinge mechanisms arranged such that said segmented wafer can be folded into a desired non-planar configuration having a high fill-factor and small gaps between tiles.

2. The microstructure of claim 1, wherein said circuitry includes metal interconnection traces that provide electrical connections between said adjacent pairs of tiles, said plurality of hinge mechanisms comprising said metal interconnection traces.

3. The microstructure of claim 2, further comprising a conformal coating on said metal interconnection traces that provide electrical connections between said adjacent pairs of tiles such that said coating provides additional mechanical coupling between said adjacent pairs of tiles.

4. The microstructure of claim 3, wherein said conformal coating comprises a polymer.

5. The microstructure of claim 3, wherein said conformal coating is applied as layers on both the top and bottom of said metal interconnection traces that provide electrical connections between said adjacent pairs of tiles.

6. The microstructure of claim 2, wherein one or more of said metal interconnection hinge mechanisms is arranged to accommodate angular deflection between said hinge mechanism's adjacent pair of tiles.

7. The microstructure of claim 6, wherein one or more of said metal interconnection hinge mechanisms includes a lateral jog in said trace between said hinge mechanism's adjacent pair of tiles.

8. The microstructure of claim 2, wherein one or more of said metal interconnection hinge mechanisms includes two or more levels of metal.

9. The microstructure of claim 1, wherein said plurality of hinge mechanisms comprise an organic material deposited on said wafer such that it provides mechanical coupling between said adjacent pairs of tiles.

10. The microstructure of claim 9, wherein said organic material comprises a vapor deposited polymer material.

11. The microstructure of claim 9, wherein said organic material is an insulating material.

12. The microstructure of claim 9, wherein said organic material comprises parylene.

13. The microstructure of claim 9, wherein said deposited organic material is patterned and etched such that it is only present in the gaps between and near the adjacent edges of said adjacent pairs of tiles.

14. The microstructure of claim 9, further comprising metal interconnection traces that provide electrical connections between said adjacent pairs of tiles, said traces formed directly over said organic material.

15. The microstructure of claim 9, further comprising metal interconnection traces that provide electrical connections between said adjacent pairs of tiles, said traces routed between said tiles via compliant bridges that span said adjacent pairs of tiles.

16. The microstructure of claim 15, wherein said compliant bridges comprise a thin film metal.

17. The microstructure of claim 9, wherein adjacent pairs of said tiles include respective recessed etches positioned so as to improve the adherence of said organic material to said wafer.

18. The microstructure of claim 1, wherein said circuitry comprises CMOS circuitry and said semiconductor wafer comprises silicon.

19. The microstructure of claim 1, wherein said tiles are shaped to permit a high fill-factor in a folded geometry.

20. The microstructure of claim 1, wherein said segmented wafer can be folded to form a piecewise curved structure.

21. The microstructure of claim 20, wherein said segmented wafer can be folded to form a piecewise semi-spherical structure.

22. The microstructure of claim 21, wherein said piecewise semi-spherical structure comprises a photodetector array.

23. The microstructure of claim 22, wherein said piecewise semi-spherical structure comprises two or more layers, at least one of said layers comprising a readout circuit for said photodetector array.

24. A foldable CMOS integrated circuit (IC), comprising:
a silicon wafer on which CMOS circuitry has been formed and which has been segmented into a plurality of tiles, said circuitry including metal interconnection traces that provide electrical connections between adjacent pairs of said tiles; and
a plurality of hinge mechanisms coupled between adjacent pairs of said tiles, said plurality of hinge mechanisms comprising said metal interconnection traces that provide electrical connections between adjacent pairs of said tiles;
said tiles and hinge mechanisms arranged such that said segmented wafer can be folded into a desired non-planar or curved configuration having a high fill-factor and small gaps between tiles.

25. The CMOS IC of claim 24, further comprising a conformal coating on said metal interconnection traces that provide electrical connections between said adjacent pairs of tiles such that said coating provides additional mechanical coupling between said adjacent pairs of tiles.

26. The CMOS IC of claim 24, wherein one or more of said metal interconnection hinge mechanisms is arranged to accommodate angular deflection between said hinge mechanism's adjacent pair of tiles.

27. The CMOS IC of claim 24, wherein one or more of said metal interconnection hinge mechanisms includes two or more levels of metal.

28. A wide field-of-view photodetector array, comprising:
a wafer on which circuitry has been formed and which has been segmented into a plurality of tiles, said circuitry including photodetectors and metal interconnection traces that provide electrical connections between adjacent pairs of said tiles;
a plurality of hinge mechanisms coupled between adjacent pairs of said tiles, said plurality of hinge mechanisms comprising said metal interconnection traces that provide electrical connections between adjacent pairs of said tiles, said tiles and hinge mechanisms arranged such that said segmented wafer can be folded into a piecewise semi-spherical structure having a high fill-factor and small gaps between tiles; and
optical elements arranged to focus incoming light on the concave surface of said piecewise semi-spherical structure such that said semi-spherical structure and optical elements form a wide field-of-view photodetector array.

29. The photodetector array of claim 28, wherein said wafer is a silicon wafer and said circuitry is CMOS circuitry.

* * * * *